United States Patent
Nonaka et al.

(10) Patent No.: US 7,516,283 B2
(45) Date of Patent: Apr. 7, 2009

(54) MEMORY CONTROL DEVICE, IN-CAR DEVICE, MEMORY CONTROL METHOD, AND COMPUTER PRODUCT FOR MANAGING DATA IN RESPONSE TO VARIOUS POWER STATES

(75) Inventors: Yoshiya Nonaka, Saitama (JP); Nobuo Tarui, Saitama (JP); Akihiro Denda, Saitama (JP); Yuji Sakamoto, Saitama (JP); Noritaka Nii, Saitama (JP)

(73) Assignee: Pioneer Corporation, Tokyo (JP)

( * ) Notice: Subject to any disclaimer, the term of this patent is extended or adjusted under 35 U.S.C. 154(b) by 134 days.

(21) Appl. No.: 11/108,833

(22) Filed: Apr. 19, 2005

(65) Prior Publication Data
US 2005/0251618 A1    Nov. 10, 2005

(30) Foreign Application Priority Data
May 7, 2004    (JP)    ............... 2004-138234

(51) Int. Cl.
*G06F 12/00*    (2006.01)
(52) U.S. Cl. ................................... 711/159
(58) Field of Classification Search ............... 711/154, 711/159
See application file for complete search history.

(56) References Cited

U.S. PATENT DOCUMENTS

| | | | | |
|---|---|---|---|---|
| 5,222,245 A | * | 6/1993 | Ando et al. | 455/13.2 |
| 5,566,314 A | * | 10/1996 | DeMarco et al. | 711/103 |
| 7,142,980 B1 | * | 11/2006 | Laverick et al. | 701/213 |

FOREIGN PATENT DOCUMENTS

| | | |
|---|---|---|
| JP | 8-272698 A | 10/1996 |
| JP | 11-328982 A | 11/1999 |

OTHER PUBLICATIONS

Dipert, Brian and Levy, Markus, Designing with Flash Memory, 1994, Annabooks, p. 14.*

* cited by examiner

*Primary Examiner*—Brian R Peugh
(74) *Attorney, Agent, or Firm*—Foley & Lardner LLP

(57) ABSTRACT

Data is stored in a non-volatile memory such as a flash memory. The non-volatile memory has two memory areas. When power of a device is turned on, data in the two memory areas are compared to determine which memory area includes old data, and the old data is erased. When the power is turned off, a control setting of the device used immediately before the power is turned off is stored as new data in the memory area from which the old data is erased. When the power is applied again, the new data is read, and the control setting is restored in the device.

12 Claims, 4 Drawing Sheets

[//]: # (US 7,516,283 B2)

MEMORY CONTROL DEVICE, IN-CAR DEVICE, MEMORY CONTROL METHOD, AND COMPUTER PRODUCT FOR MANAGING DATA IN RESPONSE TO VARIOUS POWER STATES

BACKGROUND OF THE INVENTION

1) Field of the Invention

The present invention relates to a memory control device that stores last memory data when power of a device is turned off, and reads the last memory data when the power is turned on.

2) Description of the Related Art

Some devices have a so called last memory function. A device is said to have the last memory function if, when power is turned off while the device is operating, data relating to the control settings of the device is stored in a recording medium just before the power is turned off. In such a device, when the power is turned on again, the control settings are read from the recording medium. As a result, the control settings of the device can be automatically restored to the one before the power is turned off.

Thus, the recording medium used in such devices must be able to retain data even after the power is turned off. Examples of such recording media are hard disk drives (HDD) and non-volatile memories. Examples of the non-volatile memories are flash memories, electrically erasable programmable read only memories (EEPROM), ferroelectric random access memories (FeRAM), and magnetoresistive random access memories (MRAM). The volatile recording media can also be used as the recording media. However, the volatile recording media require power supply from an auxiliary source to retain data. Examples of the volatile recording media are static random access memories (SRAM) and synchronous dynamic random access memories (SDRAM).

The flash memories are particularly advantageous; because, the flash memories are compact, light-weight, and data can be written on them in short time There are various conventional methods of writing data in the flash memory, such as those disclosed in Japanese Patent Application Publication No. H11-328982 and Japanese Patent Application Publication No. H8-272698.

The HDDs require large current, and takes time to write data because mechanical operations are required. On the other hand, with the flash memories, data writing cannot be immediately executed because data in the flash memory needs to be erased first. Erasing of data takes about 0.5 second to 2 seconds, and writing of data takes about 6 microseconds (µs) to 100 µs. Therefore, when the HDDs or the flash memories are used, the power needs to be retained for some time even after the power is turned off. This requires a high-capacity condenser, which occupies the space and increases the cost.

The EEPROM cannot store a large amount of data because it is small in capacity. The FeRAM and the MRAM are expensive because they are not yet mass produced. The SRAM and the SDRAM require auxiliary power, which not only leads to more space and cost, but also consumption of dark current.

There are devices that can be detached while the power is on, and the power is turned off when the device is detached. Such detachable devices are particularly required to quickly write data in a recording medium, so as to retain the data after being detached (i.e., after the power is turned off).

SUMMARY OF THE INVENTION

It is an object of the present invention to at least solve the problems in the conventional technology.

According to an aspect of the present invention, a memory control device includes a monitoring unit that monitors supply of power to a device; a non-volatile memory that stores data; and a memory control unit that erases data from the non-volatile memory when power to the device is turned on, and stores data in the non-volatile memory when the power is turned off.

According to another aspect of the present invention, an in-car device that is installed in a car, operates by power from the car, and includes a monitoring unit that monitors supply of power to the in-car device from the car; a non-volatile memory that stores data; a memory control unit that erases, when the power is turned on, data from the non-volatile memory and stores, when the power is turned off, data relating to a control setting of the in-car device or the car used immediately before the power is turned off as new data in the non-volatile memory; and a restore control unit that reads, when the power is turned on again, the new data and restores the control setting in the in-car device or the car used immediately before the power is turned off.

According to still another aspect of the present invention, a memory control method includes monitoring supply of power to a device; comparing, when power is turned on, two memory areas for storing data in the non-volatile memory to determine which memory area stores old data; erasing the old data from the corresponding memory area; and storing, when the power is turned off, data relating to a control setting of the device used immediately before the power is turned off as new data in the memory area from which the old data is erased.

According to still another aspect of the present invention, a computer-readable recording medium stores therein a computer program that implements the above method on a computer.

The other objects, features, and advantages of the present invention are specifically set forth in or will become apparent from the following detailed description of the invention when read in conjunction with the accompanying drawings.

DETAILED DESCRIPTION

Exemplary embodiments of the present invention will be described below with reference to accompanying drawings.

Figure 1:
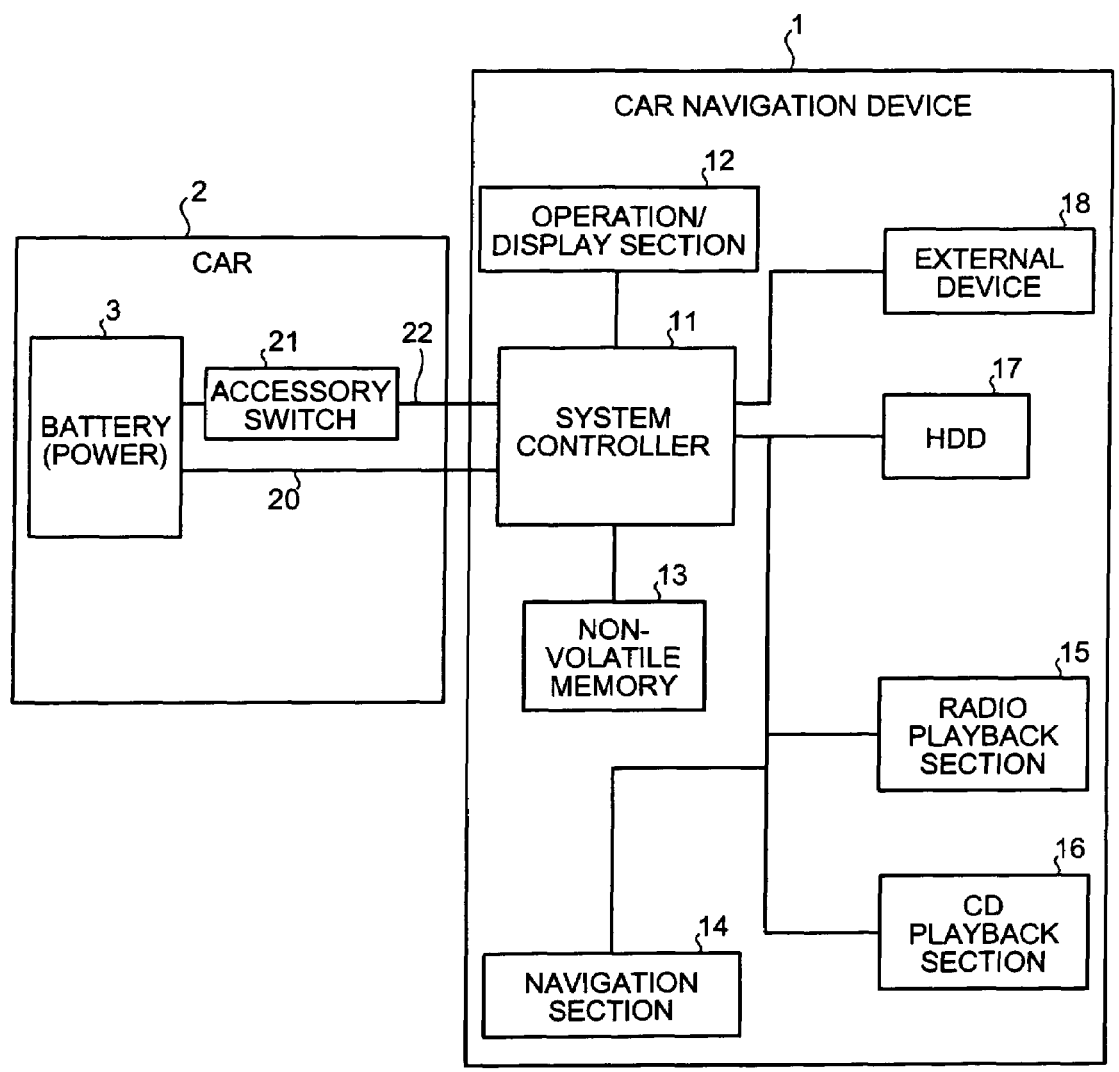
FIG. 1 is a functional block diagram of a memory control device according to an embodiment of the present invention.

A memory control device according to an embodiment of the present invention is assumed to be used in a car navigation device; however, the memory control device can be used in any other device. FIG. 1 is a functional block diagram of the memory control device. A car navigation device 1 is detachably attached to a car 2. A battery 3 of the car 2 supplies a battery power 20 to the car navigation device 1. The battery 3 also supplies an accessory power 22 to the car navigation device 1 via an accessory switch 21. The accessory power 22 can be turned on or off using the accessory switch 21

The car navigation device 1 includes a system controller 11, an operation/display section 12, a non-volatile memory 13 as a recording medium, a navigation section 14, a radio playback section 15, a compact disc (CD) playback section 16, a hard disk drive (HDD) 17, and an external device 18.

The system controller 11 includes a central processing unit (CPU) (not shown). A flash memory is used as the non-volatile memory 13. The system controller 11 executes a predetermined control program stored in the non-volatile memory 13 to realize various functions of the car navigation device 1. The system controller 11 detects voltage fluctuations of both the power 20 and the accessory power 22.

The navigation section 14 has a route guiding function that uses a global positioning system (GPS) (not shown) and so forth. The radio playback section 15 receives radio waves through an antenna (not shown), and plays back a voice of a radio program that is output from a speaker (not shown). The CD playback section 16 plays back a music CD or a digital versatile disc (DVD) that is loaded in the car navigation device 1. The CD playback section 16 can also load data from the external device 18 that is connected to the car navigation device 1. For example, when the external device 18 is a CD changer, the CD playback section 16 loads music from a CD read by the CD changer.

The operation/display section 12 includes an operation unit with keys or a touch panel, and a display unit with a liquid crystal display (LCD). The operation/display section 12 is operated to execute the functions of the car navigation device 1, and is used to display a screen that shows settings and so forth when executing the functions.

Figure 2:
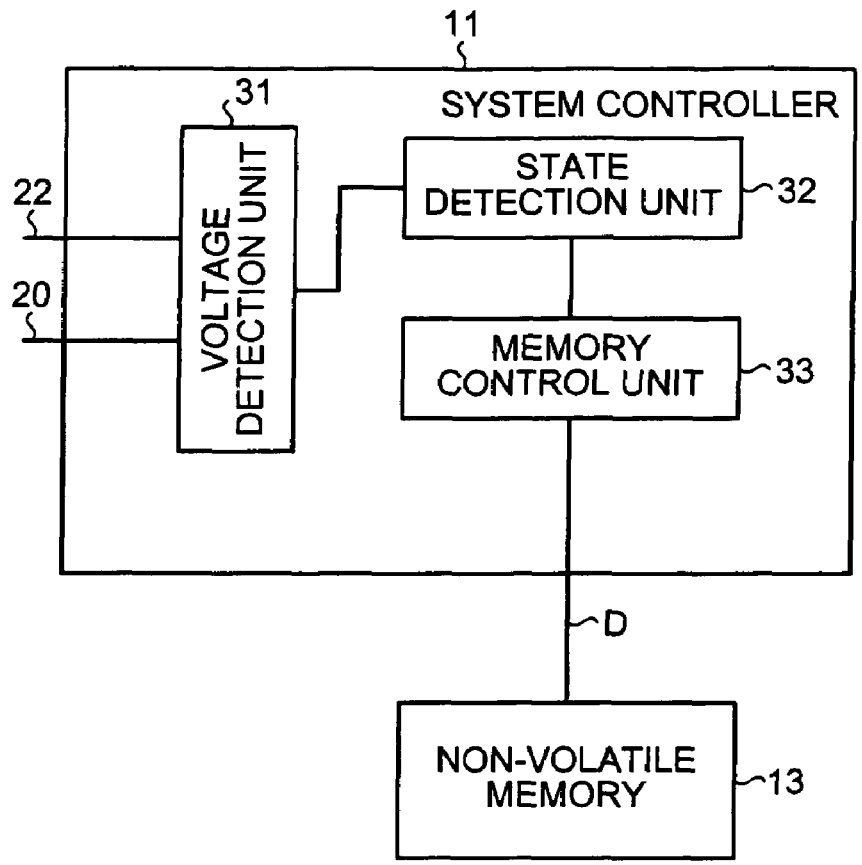
FIG. 2 is a detailed functional block diagram of a system controller shown in FIG. 1.

FIG. 2 is a detailed functional block diagram of the system controller 11 shown in FIG. 1.

The system controller 11 includes a voltage detection unit 31, a state detection unit 32, and a memory control unit 33. The voltage detection unit 31 detects whether power of the car navigation device 1 is turned on from the battery 3. Specifically, the voltage detection unit 31 compares the voltage fluctuations of the battery power 20 and the accessory power 22 with their respective thresholds. The voltage detection unit 31 detects a voltage drop of the battery 3 when the car engine starts, and a voltage drop of the accessory power 22 when the accessory switch 21 is switched off. When these voltages drop below their respective thresholds, it is determined that power of the car navigation device 1 is turned off.

The state detection unit 32 detects the state of the car navigation device 1, based on the power fluctuation detected by the voltage detection unit 31. When it is detected that the power is turned off while the car navigation device 1 is operating, the state detection unit 32 causes the memory control unit 33 to execute a processing to store data as last memory data (hereinafter, "data D"). On the other hand, when it is detected that the power is turned on, the state detection unit 32 causes the memory control unit 33 to execute a processing to read the data D.

The memory control unit 33 stores and reads the data D in and from the non-volatile memory 13. The data D corresponds to control settings of the functions controlled by the system controller 11. When the power is turned off, the memory control unit 33 stores the data D in the non-volatile memory 13. When it is detected that the power is turned on, the memory control unit 33 reads the data D from the non-volatile memory 13.

Figure 3:
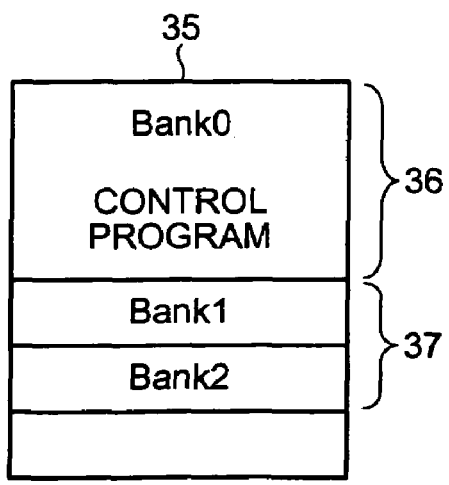
FIG. 3 is a structure of a flash memory used as a non-volatile memory shown in FIG. 2.

An example of processings executed by the memory control unit 33 is described below. FIG. 3 is a structure of the flash memory used as the non-volatile memory 13 shown in FIG. 2. The flash memory has a memory area 35 including a predetermined area (Bank0) 36 and a free area 37. The predetermined area (Bank0) 36 previously stores the control program that realizes the functions of the car navigation device 1, and the free area 37 is used to store the data D.

The free area 37 is divided into two banks (Bank1 and Bank2). The memory control unit 33 shown in FIG. 2 uses the two banks to control the storage of the data D, as follows:

(A) When the accessory switch 21 is switched on to supply the accessory power 20, the memory control unit 33 first confirms that the data D is successfully written in the flash memory and then erases the data D from one of the two banks, (B) When the power is turned off, the memory control unit 33 writes new data D in the bank from which the data D is erased in step (A), and (C) When the accessory switch 21 is switched on to supply the accessory power 20, the memory control unit 33 erases the data D from the other bank, to be prepared for the next time the power is turned off.

As mentioned in the background, erasing of data takes about 0.5 second to 2 seconds, whereas writing of data only takes about 6 μs to 100 μs. Therefore, if the data D is previously erased from either one of the two banks, new data D can be immediately written in the flash memory when power is turned off. In this case, since there is no need to erase the old data D, the overall time required to store the data D can be reduced. If the data D is stored successfully, it can be retained in the flash memory even after the power is turned off.

Figure 4:
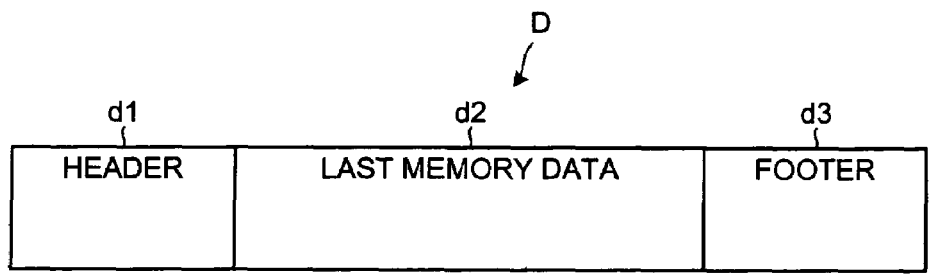
FIG. 4 is a diagram of contents of last memory data.

FIG. 4 is a diagram of contents of the data D. The data D has a header d1, last memory data d2, and a footer d3. The header d1 includes a date and a time when the last memory data d2 is stored, and a serial number. The last memory data d2 includes a last source type and a last address.

The last source type means the type of a source that is functioning (outputting data) immediately before the power is turned off. The source corresponds to the navigation section 14, the radio playback section 15, the CD playback section 16, and so forth. Examples of the last address are a position of the car 2 (latitude, longitude, etc.) immediately before the power is turned off while the navigation section 14 is route guiding the car 2; a radio channel frequency received immediately before the power is turned off while the radio playback section 15 is receiving a radio program; and a track number and a playback time position (minutes/seconds) of a music CD and a playback volume etc. immediately before the power is turned off while the CD playback section 16 is playing back the music CD. The minimum amount of data necessary is stored in the flash memory, to restore, when the power is turned on again, the same control setting used before the power is turned off.

The footer d3 includes a predetermined fixed value, such as a calculation result to detect a write error of the data D (check sum). The data D is written in the order of the header d1, the last memory data d2, and the footer d3. Therefore, it can be determined that the entire data D is written successfully, when the footer d3 is written successfully. The value in the footer d3 is used to detect whether the last memory data d2 is successfully written in the flash memory (hereinafter, whether the footer d3 is "correct" or "incorrect").

The system controller 11 performs the following processing to write and read the data D in and from the non-volatile memory 13.

Figure 5:
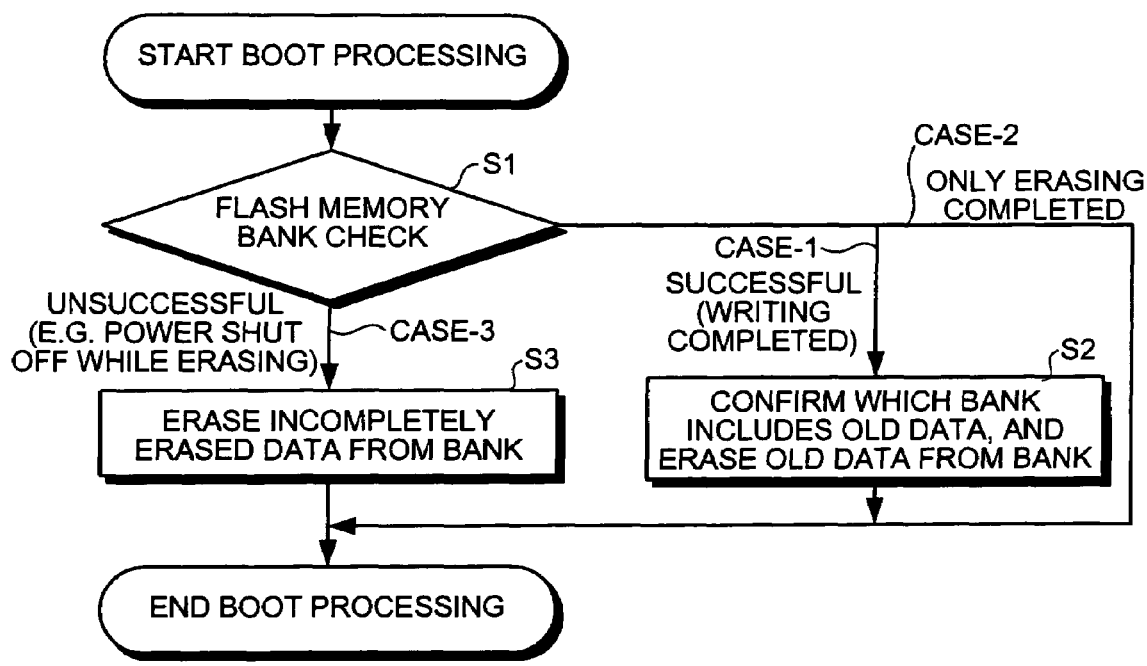
FIG. 5 is a flowchart of a processing performed by the system controller when power of a car navigation device is turned on and the system is booted.

FIG. 5 is a flowchart of the processing performed by the system controller when power of the car navigation device 1 is turned on and the system is booted. First, the banks in the flash memory are checked (step S1). Specifically, the system controller 11 checks the footers d3 in the data D written in the Bank1 and the Bank2 (see FIG. 3), respectively. When both the banks have correct footers d3, the system controller 11 checks the headers d1 of both the banks to determine which bank includes the older data D. When only one bank has a correct footer d3, and the data D in the bank with the correct footer d3 is entirely erased, the system controller 11 determines that the erasing is completed. Furthermore, the system controller 11 determines that the data D in the bank with the incorrect footer d3 is incompletely erased.

As a result of the bank check at step S1, when the data D is written in both the banks (i.e., successfully stored) (CASE-1), the system controller 11 checks the headers d1 of both the banks to determine which bank includes the older data D. The older data D is then erased from the corresponding bank (step S2) and the boot processing ends.

When only erasing of the data D is completed (CASE-2), the boot processing ends without any further steps performed. An example of CASE-2 is when new data D is not written in the empty bank because the power is turned off immediately before writing the new data D. On the other hand, when the data D is incompletely erased (i.e., unsuccessfully stored) (CASE-3), the corresponding data D is completely erased, and the boot processing ends (step S3). An example of CASE-3 is when the power is turned off while the data D is being erased.

Accordingly, the system controller 11 detects, based on the headers d1 and the footers d3, whether the data D is stored successfully or unsuccessfully. When the boot processing ends, the system controller 11 reads the new data D from either one of the banks, and restores the same control setting used before the power is turned off.

Figure 6:
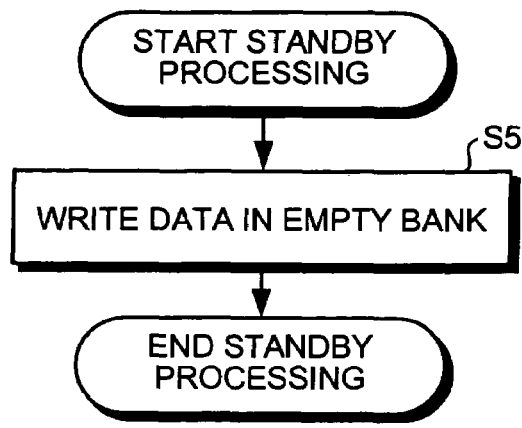
FIG. 6 is a flowchart of a standby processing performed by the system controller when the power is turned off from the car navigation device.

FIG. 6 is a flowchart of a standby processing performed by the system controller when the power is turned off. The standby processing is executed during a standby state after the power is turned off. The new data D is written in the empty bank, from which the old data D is erased (step S5) and the standby processing ends. The data D is written in the order of the header d1, the last memory data d2, and the footer d3.

Figure 7A:
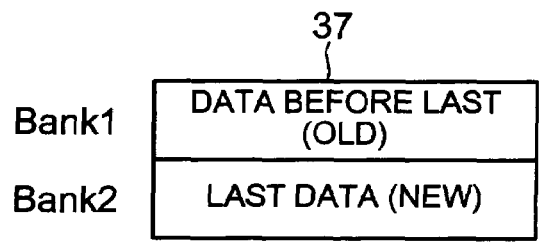
FIGS. 7A to 7C are diagrams that explain how two banks are used alternately.
Figure 7B:
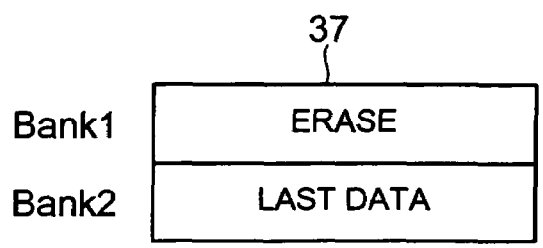
Figure 7C:
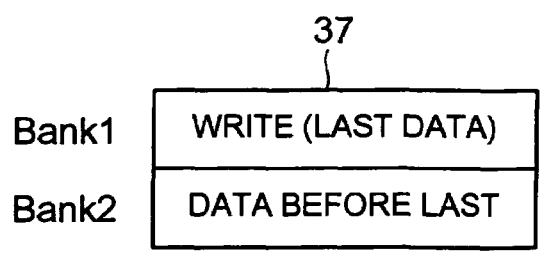

FIGS. 7A to 7C are diagrams that explain how the two banks, Bank1 and Bank2, are used alternately. The data D is alternately written in the two banks. In the following description, it is assumed that the data D is successfully written and erased.

In the case shown in FIG. 7A, the Bank1 includes the data D before the last (old), and the Bank 2 includes the last data D (new). In the case shown in FIG. 7B, the data D before the last (old) in the Bank1 is erased when the power is turned on and the system is booted. The Bank2 retains the last (new) data D.

In the case shown in FIG. 7C, the standby processing is performed as the power is turned off, and new data D is written in the empty Bank1, from which the data D before the last (old) is erased. The data D in the Bank2 is retained, but becomes the data D before the last (old), because the data D in the Bank1 is newer. This processing is repeated, so that the old data D is constantly erased from one bank, allowing the new data D to be written in the empty bank.

With reference to FIGS. 5 and 6, the processing that uses the two banks in the flash memory is described in detail according to passage of time.

1. Before Shipment of Car Navigation Device 1 (Default Setting)

In the default setting, no data is present in any of the banks (Bank1, Bank2). When power is turned on, both the banks are determined to be empty at step S1 in FIG. 5. The Bank1 is set as the older bank as a default setting. Therefore, when the power is turned off, the data D is written in the Bank1 at step S5 in FIG. 6.

2. Operation at First Power On

When the power is turned on again, i.e., after the power is turned off in the above step 1, the empty Bank2 is determined to be older at the bank check at step S1, i.e., CASE-2. Therefore, the boot processing ends straight. The data D stored in Bank1 is read, and the car navigation device 1 starts to operate. When the power is turned off again, new data D is written in the empty Bank2 at step S5.

3. Operation at Second Power On

When the power is turned on again, i.e., after the power is turned off in the above step 2, the data D in the Bank1 is determined to be older based on the header d1 at the bank check at step S1. Therefore, the data D in the Bank1 is erased. The data D stored in Bank2 is read, and the car navigation device 1 starts to operate. When the power is turned off again, new data D is written in the empty Bank1 at step S5 in FIG. 6.

4. Operation at Third Power On

When the power is turned on again, i.e., after the power is turned off in the above step 3, the data D in the Bank2 is determined to be older based on the header d1 at the bank check in FIG. 5 (step S1). Therefore, the data D in the Bank2 is erased. The data D stored in Bank1 is read, and the car navigation device 1 starts to operate. When the power is turned off again, new data D is written in the empty Bank2 at step S5.

According to the embodiment, when the power is turned off accidentally or by a user's operation, the control setting used immediately before the power is turned off is stored in the non-volatile memory 13 as the last memory data (data D). When the power is turned on again, automatically or by the user's operation, the data D stored in the non-volatile memory 13 is read so as to restore the same control setting used before the power is turned off. The low-cost flash memory can be used as the non-volatile memory 13.

As it takes considerable time to erase data from the flash memory, the data is previously erased when the power is turned on. Accordingly, when the power is turned off, the data is immediately written in the flash memory without needing to erase the data. This reduces the time required to retain the power when the power is turned off, so that a low-capacity condenser can be used to retain the power. The low-capacity condenser occupies less space, which leads to a compact device and low cost, as compared to the case when a high-capacity condenser is used.

The embodiment is particularly effective when the car navigation device 1 is detached from the car 2, and used at home afterward. The embodiment can be similarly applied to in-car devices other than a car navigation device, such as CD/DVD playback devices, radio sets, and television sets.

Any recording medium other than the flash memory can be used as long as data is retained after power is turned off. The examples of such flash memories are EEPROMs, FeRAMs, and MRAMs. However, it is preferable to use a recording medium that has a capacity large enough to store the data D, and that can quickly store the data D immediately when the power gets turned off.

A memory control method according to the embodiment of the present invention can be realized by causing a computer such as a personal computer or a work station to execute a predetermined computer program. The computer program can be stored in and read from a computer-readable recording medium such as a hard disk, a flexible disk, a CD-ROM, an MO, and a DVD. On the contrary, the computer program can be distributed through a network such as the Internet.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

The present document incorporates by reference the entire contents of Japanese priority document, 2004-138234 filed in Japan on May 7, 2004.

What is claimed is:

1. A memory control device comprising:
a monitoring unit that monitors supply of power to a device;
a non-volatile memory that includes a first memory area and a second memory area for storing first data and second data, respectively; and
a memory control unit that erases the first data that is older than the second data from the first memory area in response to the power to the device being turned on, and stores third data in the first memory area in response to the power to the device being turned off.

2. The memory control device according to claim 1, further comprising a restore control unit, wherein
the memory control unit stores, as the third data, data relating to a control setting of the device used immediately before the power is turned off, and
the restore control unit reads, the third data and restores the control setting when the power is turned on again.

3. The memory control device according to claim 2, wherein
the third data includes a header that indicates when the third data is stored, a last memory data that indicates the control setting used immediately before the power is turned off, and a footer that indicates whether the third data is successfully stored, and
the memory control unit stores the third data, when the power is turned off, in the order of the header, the last memory data, and the footer.

4. The memory control device according to claim 3, wherein the memory control unit determines, when the power is turned on again, based on the footer, whether the third data is successfully stored when the power is turned off.

5. The memory control device according to claim 1, wherein the non-volatile memory is a flash memory.

6. An in-car device that is installed in a car, and operates by power from the car, comprising:
a monitoring unit that monitors supply of power to the in-car device from the car;
a non-volatile memory that includes a first memory area and a second memory area for storing first data and second data, respectively;
a memory control unit that erases the first data that is older than the second data from the first memory area in response to the power to the in-car device being turned on, and stores, in response to the power to the in-car device being turned off, third data relating to a control setting of the in-car device or the car used immediately before the power is turned off in the first memory area; and
a restore control unit that reads the third data and restores the control setting in response to the power to the in-car device being turned on again.

7. A memory control method of controlling a non-volatile memory that includes a first memory area and a second memory area for storing first data and second data, respectively, the memory control method comprising:
monitoring supply of power to a device;
erasing the first data that is older than the second data from the first memory area in response to the power to the device being turned on; and
storing, in response to the power to the device being turned off, third data relating to a control setting of the device used immediately before the power to the device is turned off in the first memory area.

8. The memory control method according to claim 7, further comprising:
reading the third data and restoring the control setting when the power is turned on again.

9. A computer-readable recording medium that stores therein a computer program for controlling a non-volatile memory that includes a first memory area and a second memory area for storing first data and second data, respectively, wherein the computer program causes a computer to execute:
monitoring supply of power to a device;
erasing the first data that is older than the second data from the first memory area in response to the power to the device being turned on; and
storing, in response to the power to the device being turned off, third data relating to a control setting of the device used immediately before the power to the device being turned off in the first memory area.

10. A memory control device, comprising:
a monitoring unit that monitors supply of power to a device;
a non-volatile memory that includes a first memory area and a second memory area; and
a memory control unit, wherein first data is stored in the first memory area and second data is stored in the second memory area before the power of the device is turned on, and wherein
when the power of the device is turned on, the memory control unit erases older data of the first data and the second data and makes newer data of the first data and the second data usable by the device, and when the power of the device is turned off, the memory control unit, without erasing the newer data, stores third data in the first memory area or second memory area where the older data has been erased.

11. A memory control method of controlling a non-volatile memory that includes a first memory area and a second memory area for storing first data and second data, respectively, the memory control method comprising:
monitoring supply of power to a device;
storing the first data and the second data before the power of the device is turned on:
erasing older data of the first data and the second data and making newer data of the first data and the second data usable by the device when the power of the device is turned on; and
storing third data in the first memory area or second memory area where the older data has been erased when the power of the device is turned off without erasing the newer data.

12. A computer-readable recording medium that stores therein a computer program for controlling a non-volatile memory that includes a first memory area and a second memory area for storing first data and second data, respectively, wherein the computer program causes a computer to execute:

monitoring supply of power to a device;

storing the first data and the second data before the power of the device is turned on erasing older data of the first data and the second data and making newer data of the first data and the second data usable by the device when the power of the device is turned on; and storing third data in the first memory area or second memory area where the older data has been erased when the power of the device is turned off without erasing the newer data.

* * * * *